United States Patent [19]
Evers

[11] Patent Number: 5,836,454
[45] Date of Patent: Nov. 17, 1998

[54] LEAD FRAME CASING

[75] Inventor: Sven Evers, Boise, Id.

[73] Assignee: Micron Technology, Inc., Boise, Id.

[21] Appl. No.: 587,641

[22] Filed: Jan. 17, 1996

[51] Int. Cl.⁶ .................................................. B65D 85/62
[52] U.S. Cl. ........................... 206/723; 206/556; 206/455
[58] Field of Search .................................... 206/449, 555, 206/556, 1.5, 480, 455, 456, 568, 723, 706, 722, 724, 775

[56] References Cited

U.S. PATENT DOCUMENTS

| | | | |
|---|---|---|---|
| 778,696 | 12/1904 | McKenzie | 206/561 |
| 1,541,173 | 6/1925 | Ormond | 206/561 |
| 1,637,498 | 8/1927 | Osborn | 206/561 |
| 2,997,168 | 8/1961 | Tall | 206/456 |
| 3,360,258 | 12/1967 | Nix . | |
| 3,469,684 | 9/1969 | Keady et al. . | |
| 3,691,289 | 9/1972 | Rohloff . | |
| 3,828,922 | 8/1974 | Holdestad | 206/1.5 |
| 4,043,485 | 8/1977 | Tippetts . | |
| 4,295,565 | 10/1981 | Takeuchi | 206/455 |
| 4,415,079 | 11/1983 | Ackeret | 206/556 |
| 4,457,662 | 7/1984 | Ireland et al. . | |
| 4,483,441 | 11/1984 | Akizawa et al. . | |
| 4,595,480 | 6/1986 | Takiar et al. . | |
| 4,683,644 | 8/1987 | Tange et al. . | |
| 4,798,305 | 1/1989 | Laverty . | |
| 4,881,639 | 11/1989 | Matsuoka et al. | 206/724 |
| 5,012,925 | 5/1991 | Gallagher, Sr. . | |
| 5,012,936 | 5/1991 | Crum | 206/556 |
| 5,076,204 | 12/1991 | Hisamune . | |
| 5,114,005 | 5/1992 | Cote et al. . | |
| 5,125,509 | 6/1992 | Takei et al. . | |
| 5,143,510 | 9/1992 | Takamura et al. . | |
| 5,200,368 | 4/1993 | Kojima et al. . | |
| 5,208,464 | 5/1993 | Yonemoto et al. . | |
| 5,220,997 | 6/1993 | Ushiki et al. . | |
| 5,310,055 | 5/1994 | Chu . | |
| 5,448,877 | 9/1995 | Chu . | |
| 5,549,754 | 8/1996 | Okuhara . | |

*Primary Examiner*—Paul T. Sewell
*Assistant Examiner*—Anthony Stashick
*Attorney, Agent, or Firm*—Trask, Britt & Rossa

[57] ABSTRACT

A lead frame casing for housing a stack of lead frame strips. The casing includes a central volume defined between substantially reference members and resilient members. The substantially rigid member define at least one reference plane and the resilient members are deflected toward the substantially rigid members when a lid is placed over the casing to align the strips of the stack against the reference plane and immobilize the stack to prevent damage during transport and handling of the casing and to facilitate handling of the lead frames by automated equipment.

19 Claims, 5 Drawing Sheets

LEAD FRAME CASING

BACKGROUND OF THE INVENTION

1. Field of the Invention

The present invention relates to an apparatus and a method for loading and storing lead frames such as are employed for the physical support and electrical connection of semiconductor devices. In particular, the present invention relates to a lead frame casing mechanism that aligns and immobilizes lead frames within the casing against a reference plane, for prevention of damage to the lead frames and ease of unloading by automatic mechanisms as employed in the art.

2. State of the Art

Integrated circuit (IC) semiconductor dies, also termed "chips" are enclosed in packages that provide protection from hostile environments and enable chip electrical interconnection to printed-circuit boards and other components. Lead frames are widely used in the packaging of semiconductor dies, for physical support of the die and to provide conductors for the die to the exterior of the package, which may be a transfer-molded plastic package, a ceramic package, a so-called "glob top" package, or other package structure known in the art.

Included within each lead frame of a conventional design are a plurality of leads and a central die attach pad area, typically termed a paddle, tab or island. The die attach pad area may be downset from the plane defined by the leads. With such a design, when a die is attached on the pad area, the top or active surface of the die is substantially co-planar with the leads of the lead frame so that bond wire lengths between the bond pads on the active surface and the inner lead ends are minimized. With other conventional lead frame designs, the entire frame is co-planar, and longer bond wires are employed to connect the bond pads on the active surface of the die with the inner ends of the leads. Another variation of lead frame design is the so-called leads-over-chip, or LOC, design, which eliminates the central die attach area and adhesively suspends the die by its active surface from a number of leads extending over the active surface.

In practice, a plurality of laterally adjacent lead frames are etched or stamped from a strip of metal, the frames remaining secured together through the packaging or encapsulation step of the fabrication process. This intermediate structure is commonly known as a "lead frame strip." The number of lead frames fabricated within each lead frame strip varies, depending on the size of the individual lead frames and the equipment and materials for processing them to attach the dies, wire bond and encapsulate the devices.

Lead frames are often fabricated by a vendor to the semiconductor device fabricator, rather than by the fabricator itself. The lead frames are stamped or etched, as noted above, and then shipped to the fabricator for die attachment, wire bonding, and encapsulation. At a minimum, the lead frame strips may be bundled, wrapped in thin paper or plastic wrap, and placed into a shipping tray. Layers of paper or plastic may be interposed between strips for additional protection. Conventional shipping trays consist of a flat bottom, two sets of opposing sides, and an open top. Within the tray, one or more movable partitions may be provided for accommodating the adjacent bundles of lead frame strips. Alternatively, stuffing materials may be included within the tray to accommodate the lead frame strips.

U.S. Pat. No. 4,798,305 issued Jan. 17, 1989 to Laverty discloses a variety of prior art shipping trays, including a tray design with movable partitions to accommodate different sizes and quantities of lead frames.

U.S. Pat. No. 5,125,509 issued Jun. 30, 1992 to Takei et al. discloses a rectangular lead frame container including a container body and a snap-on lid, the container body optionally including fixed or rigid projections or protrusions from the side walls to abut a stack of lead frames in the container.

A more complex shipping tray, also termed a "magazine", is described in U.S. Pat. No. 5,310,055 issued May 10, 1994 to Chu. The Chu patent provides a magazine for automatically collecting lead frame strips dispensed from an automated lead frame quality inspection machine. The magazine includes a cover that is placed over the magazine to provide a packaging tray for shipment of the collected lead frame strips. A plurality of holes is positioned within the base of the magazine. The magazine holes are positioned to lie directly underneath index holes within the lead frame strips when the lead frame strips are stacked inside the magazine. To prevent movement of the lead frame strips within the magazine during shipment, pins are inserted vertically into the index holes of the lead frame strip and through the magazine holes. Similarly-aligned holes to receive the pin tops are also included in a shield covering the top lead frame strip to protect the lead frame stack from oxidation and contamination.

The prior art shipping trays and containers of Laverty and Takei do not provide positive alignment of the lead frame strips against a reference plane, and their construction dictates that a snug fit or abutment of the lead frame strips against the partitions or projections may damage the strips if they are forced into the volume provided in the tray or container. If some clearance is allowed between the partitions or projections and the strips, movement is thereby permitted and damage may also ensure in that situation.

The prior art tray of Chu utilizing indexing pins to immobilize a lead frame strip stack has a significant disadvantage from a production standpoint, since any change in the positioning of the index holes within the lead frame strips requires a change in the production mold for the magazine and shield. Additionally, the pin alignment mechanism requires removal of the pins in order to release the lead frame strips from the tray for pick up by a strip unloading apparatus.

Therefore, it would be advantageous to develop a lead frame casing that aligns at least one side of a vertical stack of lead frame strips against a common reference plane and prevents any motion of the lead frame strips within the casing during shipment to avoid damage, but which still permits easy release and removal of the lead frame strips from the casing. It would be a further advantage to develop a lead frame casing design which is adaptable to permit immobilization of lead frame strips having assorted lengths and widths as well as index hole patterns without significant design changes, the use of different-sized partitions, or additional parts such as indexing pins.

SUMMARY OF THE INVENTION

The present invention relates to an apparatus and a method for loading, aligning and storing lead frame strips. The apparatus includes at least a casing and a lid. The casing includes a base, which provides a support for the collected lead frame strips, which are stacked in mutually superimposed relationship. Two opposing and mutually parallel side walls and two opposing and mutually parallel end walls oriented transversely to the side walls extend upwardly from the base to form an enclosure around the lead frame strips housed in the casing. The enclosure created by the side and end walls is open at the top to provide access into the casing.

The casing interior also includes one or more substantially rigid vertical columns, and preferably three such columns, against which the lead frame strips are aligned in at least one, and preferably two, common reference planes as they are introduced into the casing. One or more flexible or resilient vertical columns are laterally spaced from the substantially rigid columns within the casing in opposition to one or more of the rigid columns and define, with the rigid columns, a casing volume in which the lead frame strip stack is contained. An optional but preferred feature of the invention is a support plate disposable in the bottom of the casing over the base and within the lead frame strip casing volume to support the lead frame stack from below and provide a means for lifting the stack from the bottom of the casing for unloading, as by a robotic or other automatic unloading apparatus. In this case, an aperture of slightly smaller lateral dimensions than the support plate is provided in the base of the casing.

The lid is substantially flat or planar, adapted for placement on the casing and substantially covers the stacked lead frame strips by covering the top opening of the casing. The lid includes one or more angled steps of a like number to the flexibly mounted columns that are positioned to come into contact with the upper ends of the flexible or resilient columns extending from the casing when the lid is secured thereon, such as by sliding, pressing (snap-on) or similar known locking mechanism. By closing the casing with the lid, such as by sliding the lid onto the top of the casing, the angled steps come into contact with the flexible or resilient columns, forcing those resilient columns in a pivotal manner toward their opposing, cooperating rigid columns and thereby immobilizing the stack of lead frame strips located between the rigid and resilient columns.

BRIEF DESCRIPTION OF THE DRAWINGS

The advantages, as well as other novel and important features of the present invention will be better understood when the following description is read along with the accompanying drawings of which.

DETAILED DESCRIPTION OF THE PREFERRED EMBODIMENT

Figure 1:
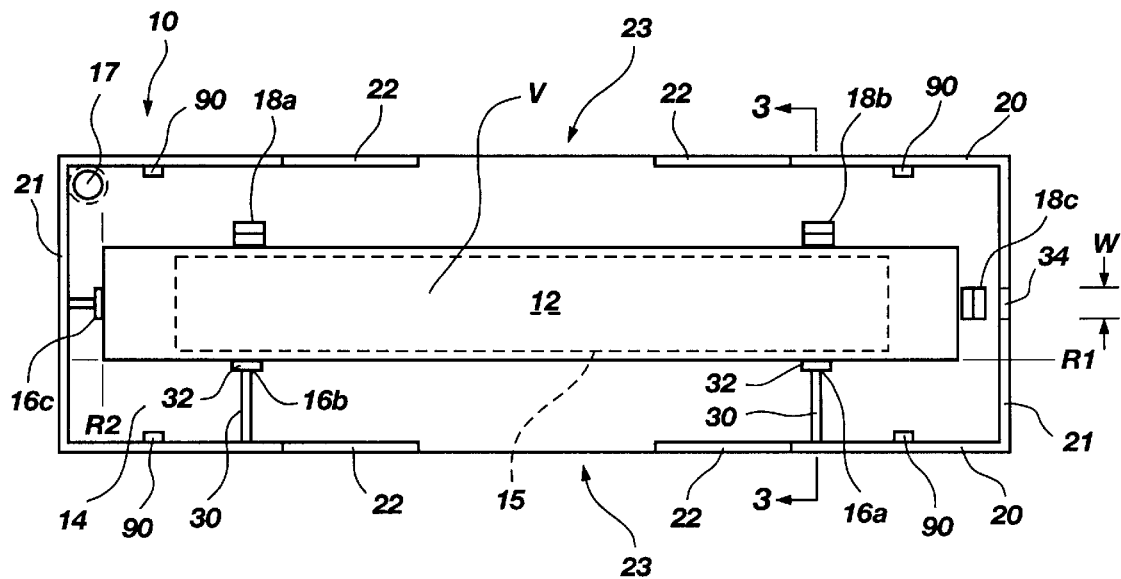
FIG. 1 is a top view of a preferred embodiment casing according to the present invention, which illustrates the placement of the rigid columns and the resilient columns within the casing with respect to a contained lead frame strip.
Figure 8:
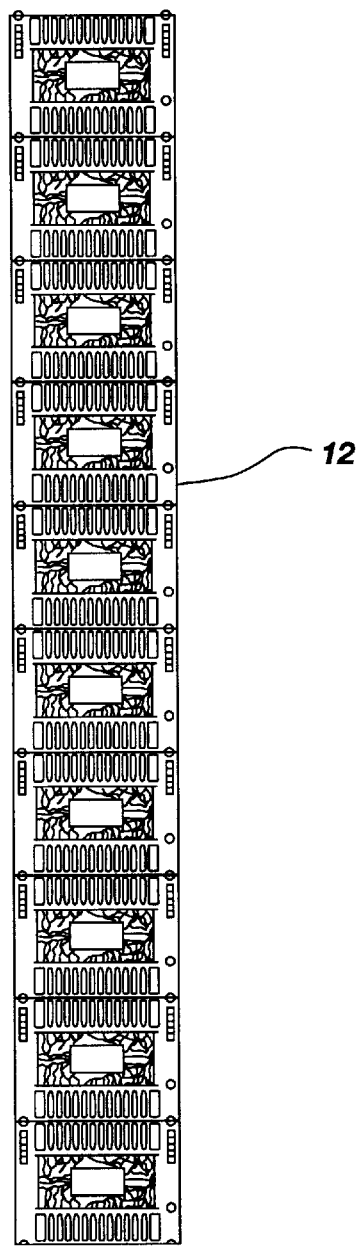
FIG. 8 is a top view of an exemplary lead frame strip to be contained by the casing of the present invention.

Referring to FIG. 1, a top view of a lead frame casing 10 according to the present invention is shown. A plurality of exemplary lead frame strips 12 is shown vertically stacked in casing 10. Details of the lead frame strip are shown in FIG. 8. The casing 10 includes a flat base 14 having a longitudinal aperture 15 therein (shown in broken lines), two opposing, mutually parallel planar side walls 20 extending vertically upwardly from base 14, and two opposing, mutually parallel end walls 21 extending vertically upwardly from base 14 and joined to the side walls 20 at the corners of the casing 10. Circular clearance hole 17 in base 14 is used for correct positioning and identification of "Pin One" on the lead frames by automated equipment. A plurality of rigid vertical columns 16a, 16b and 16c extend vertically upwardly from the base 14, and a plurality of flexible, resilient or movable vertical columns 18a, 18b and 18c extend vertically upwardly from the base 14 in spaced lateral relationship to their respectively cooperating rigid vertical columns, as will be explained hereafter.

Figure 2:
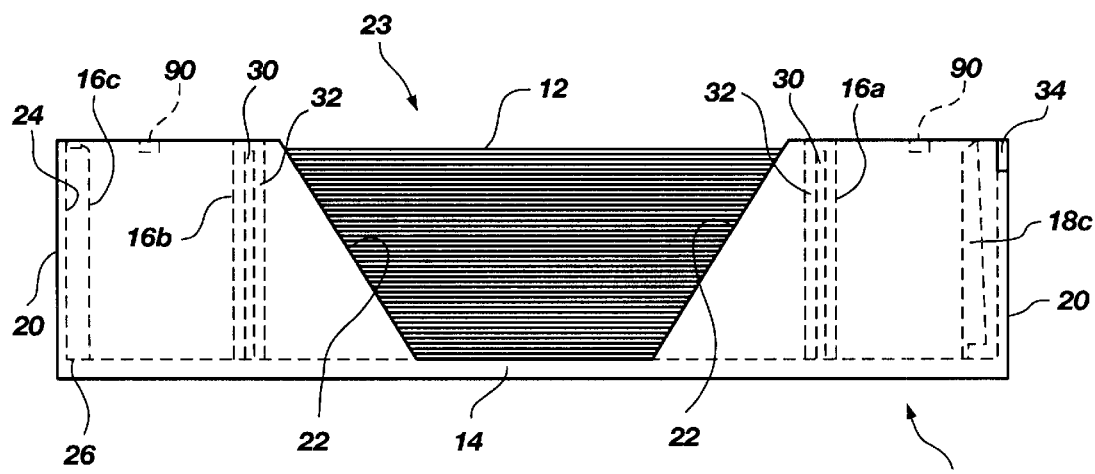
FIG. 2 is a side view of the casing of FIG. 1, which illustrates the orientation and placement of the rigid vertical columns and the movable vertical columns within the casing.

In a preferred embodiment, the two side walls 20 will have sloped interior edges 22, which slope downwardly from the top edges of the walls 20 and terminate proximate the base 14 (see FIG. 2). The sloped edges 22 define one, and preferably two, opposing openings 23, which provide lateral access to the interior of the casing 10 and facilitate handling of the lead frame strips 12 during loading and unloading of the same from the casing 10. A cut-out 34 is included on the upper region of one of the end walls 21, the cut-out 34 thus creating a clearance which permits the entry of an angled step 62c protruding from a lid 60 (FIG. 4) to the interior of the casing 10 before the lid 60 is completely longitudinally slid onto the top of casing 10.

The plurality of rigid vertical columns 16a, 16b and 16c each preferably include a rib segment 30 which lies in substantially perpendicular orientation with respect to the side or end wall to which that vertical column 16 is coupled, and a flange segment 32, which lies substantially perpendicular to the rib segment and substantially parallel to the side or end of the stack of lead frame strips 12 which it abuts when a stack is loaded in the casing. The flange segments 32 create at least one vertical reference plane RI, and preferably first and second vertical reference planes R1 and R2, for mutually aligning a side and an end of each strip of the stacked lead frame strips 12 within the casing 10.

Laterally spaced from and on an opposing side or end of the lead frame volume from each of the rigid vertical columns 16a, 16b and 16c, respectively lies one of the plurality of flexible, resilient or movable vertical columns 18a, 18b and 18c in substantially parallel relationship to its associated rigid column. The respective placement of the movable vertical columns 18 and the rigid vertical columns 16 forms a rectangular boundary defining the lateral boundaries of a central lead frame volume V, which volume is marginally longer and wider than the lead frame strips 12 to be inserted into the casing 10. The plurality of flexible or resilient vertical columns 18a, 18b and 18c guide the lead frame strips 12 into the lead frame volume V of the casing 10 defined by the columns 16 and 18, and generally align the lead frame strips 12 against the reference planes R1 and R2 created by the flange segments 32 of the plurality of rigid vertical columns 16.

In a preferred embodiment, casing 10 may be approximately 2.5 inches in width, 8.0 inches in length, and 2.0 inches in height, although specific dimensions are, of course, variable with the size and number of lead frame strips 12 to be accommodated by casing 10. The rectangular boundary formed by the rigid vertical columns and the movable vertical columns is dictated by the length and width of the lead frame strips 12 to be stacked in volume V. Thus, the placement of the rigid vertical columns 16 and the movable vertical columns 18 varies according to the size of the lead frame strips 12 to be loaded.

Referring to FIG. 2, a side view of the casing 10 according to the present invention is shown, illustrating the placement and configuration of the plurality of rigid vertical columns 16a, 16b and 16c and one of the plurality of movable vertical columns 18c within the casing 10. Each of the plurality of rigid vertical columns 16a, 16b and 16c is joined to one of the plurality of side walls or end walls at a first point 24 (FIG. 2) and is coupled to the base 14 at a second point 26 (FIG. 2).

Figure 3:
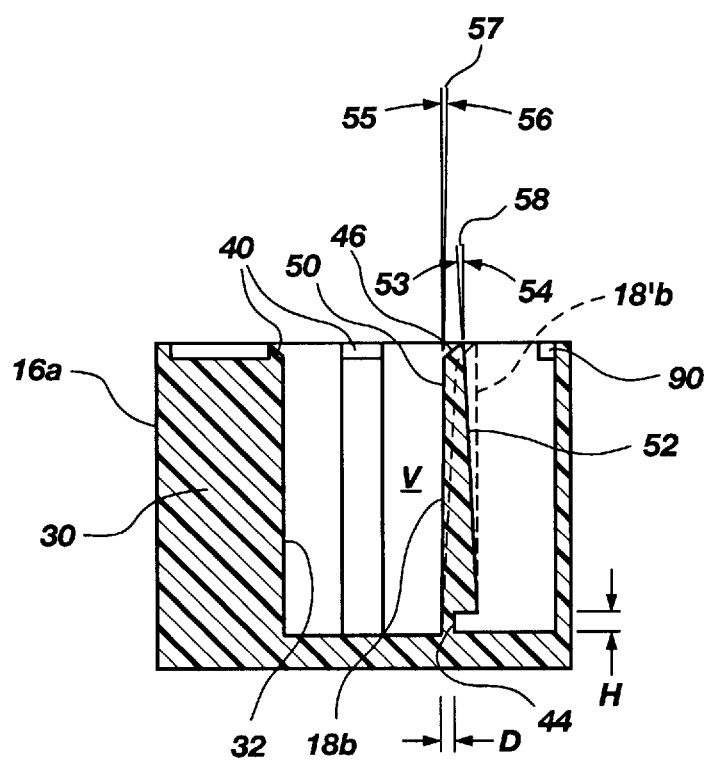
FIG. 3 is a sectional side view of the casing of FIG. 1 taken along line 3—3 of FIG. 1.

Referring to FIG. 3, an enlarged, sectional side view along the line 3—3 of FIG. I of the casing 10 is shown, illustrating a section of the rigid vertical column 16a and a flexible or resilient, also termed movable, vertical column 18b in some detail. The flange segment 32 of each of the plurality of rigid vertical columns 16 includes a beveled, chamfered, radiused or otherwise tapered tip 40 for guiding the adjacent side or end of each one of the plurality of lead frame strips 12 being loaded into casing 10 towards the center of the casing and volume V. The beveled tip 40 of the parallel segment 32 will slope downwardly and toward the center of the casing 10. Preferably, the height of the rib segment 30 is less than the height of the corresponding flange segment 32 of each of the plurality of rigid vertical columns 16 to permit the passage of locking tabs on the underside of the lid 60 thereover.

As shown here, the flexible or resilient vertical column 18b includes a thin recessed segment 44 at a point where the column 18 is joined to the base 14. This construction is illustrative of that of all of the columns 18. The recessed segment 44 imparts added flexibility to the vertical column 18, acting as a resilient hinge. Preferably, the recessed segment 44 is shaped so that the height H of the recessed segment 44 is greater than the depth D of the recessed segment 44, although this is not required. In a preferred embodiment, the height H of the recessed segment is 1.25 to 2.50 times greater than the depth D of the recessed segment 44. While such ratios of height to depth are desirable, it should be understood that any web segment of suitable height, width and depth imparting flexibility to the movable vertical column 18 is acceptable. For torsional rigidity of the columns 18 it is preferred, although not required, that the width W (see FIG. 1) of the web segments is coextensive with that of the main body of the columns extending upwardly therefrom, so that contact with an angled step 62 as subsequently described will cause deflection, rather than rotation, of the column 18.

Each of the plurality of movable vertical columns 18 also includes a beveled, chamfered, radiused or otherwise tapered tip 46 for guiding each one of the plurality of lead frame strips 12 towards reference planes R1 and R2 bounding volume V at the center of the casing. The tapered tip 46 of each movable vertical column 18 will slope downwardly and toward the center of the casing 10.

Each of the plurality of movable vertical columns 18 further includes a proximal side 50, which faces the center and volume V of the casing 10, and a distal side 52, which faces away from the center of said casing 10. The proximal side 50 is sloped upwardly and away from the center of the casing 10. Exemplary column 18b is shown in FIG. 3 in a deflected or inwardly-rotated position as it would reside against a stack of lead frame strips 12 disposed in volume V. A first reference axis 54 and a second reference axis 55 for column 18b are shown in FIG. 3, both of which axes lie in substantially perpendicular orientation with respect to the base 14. The proximal side 50 extends along an axis 56 oriented with respect to the second reference axis 55 at an angle 57 which preferably is within about 0.50 when column 18b is biased against the stack of lead frame strips. The distal side 52 is sloped upwardly and toward the center of the casing 10. The distal side 52 extends along an axis 53 oriented with respect to the first reference axis 54 at an angle 58 which is preferably within about 2° to 4° when column 18b is biased against the stack of lead frame strips. A dotted representation 18b' of flexible or resilient vertical column 18b is shown, illustrating column 18b in a relaxed or non-deflected position, prior to being contacted by the angled steps 62 of the lid 60, as further described in FIGS. 4 and 5. The foregoing angular relationships preferably apply to all columns 18.

Figure 4:
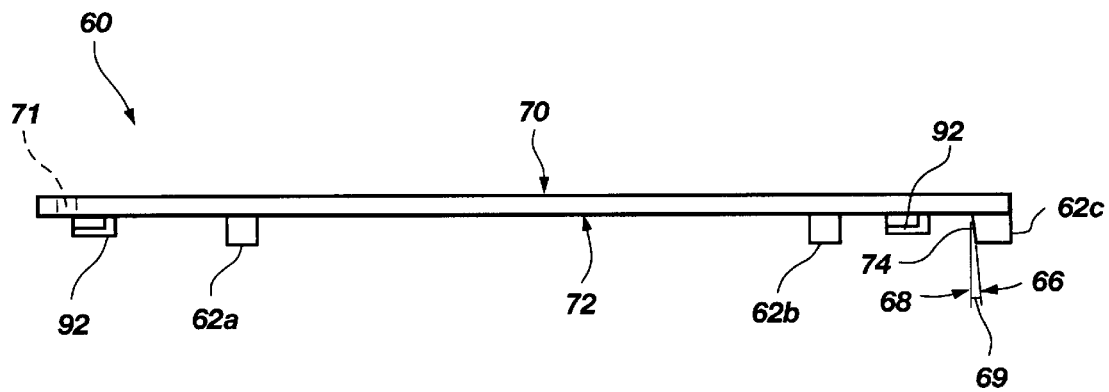
FIG. 4 is a side view of a preferred embodiment of the lid according to the present invention, which illustrates the placement and configuration of the angled steps coupled to the lid.
Figure 5:
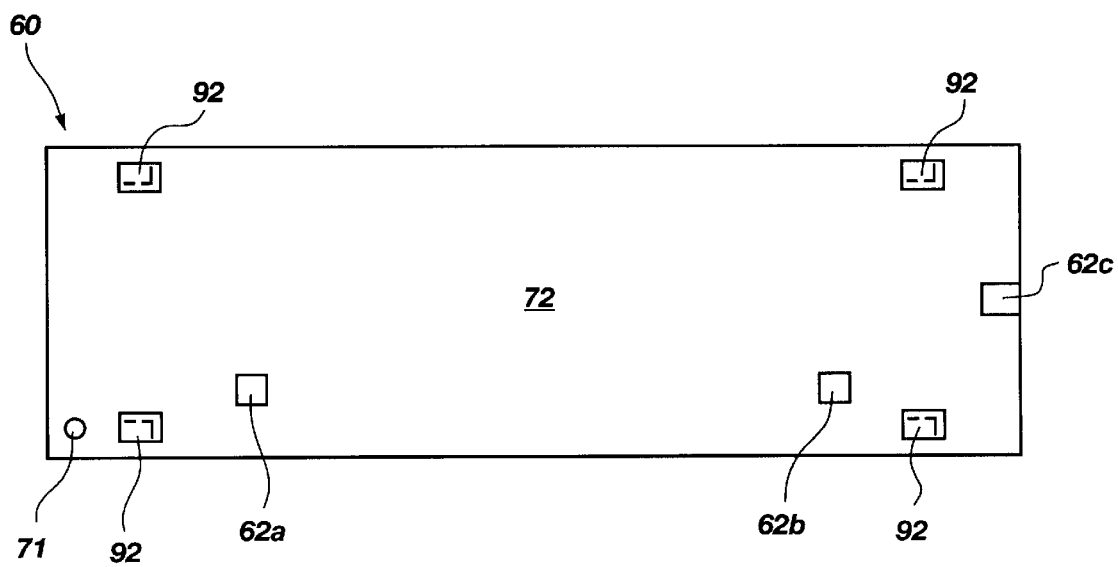
FIG. 5 is a bottom view of the lid, which illustrates the placement and configuration of the angled steps coupled to the lid.

FIG. 4 is a side view of the lid 60, having a top 70 and a bottom 72. The lid 60 includes a plurality of angled steps 62a, 62b and 62c protruding downwardly (as lid 60 is employed with casing 10) from the bottom 72 of the lid 60. The plurality of angled steps 62 is positioned, as shown in FIG. 5, so as to contact the corresponding plurality of flexible or resilient vertical columns 18a, 18b and 18c of the casing 10. The plurality of angled steps 62a, 62b and 62c each include a slightly angled or tapered inner side 74, which faces the center of said lid 60 and which is sloped outwardly and away from the center of said lid 60. A third reference axis 68 is shown in FIG. 4, which lies in substantially perpendicular orientation with respect to the bottom 72 of the lid 60. The inner side 74 extends along an axis 66 oriented with respect to the third reference axis 68 at an angle 69 which is preferably about 4° to 5°. Lid 60 includes a circular hole 71, alignable with hole 17 when lid 60 is secured to casing 10, for positioning and identification purposes.

Referring to FIG. 5, a bottom view of the lid 60 is shown, illustrating the placement of the angled steps 62a, 62b and 62c coupled to the lid 60. The lid 60 will typically have a width and length adapted to match the top opening of the casing 10 so as to substantially cover the casing 10 to its outer perimeter. In a preferred embodiment as employed with casing 10, the lid 60 has a width of 2.5 inches, a length of 8.0 inches, and an approximate thickness of 0.16 inches. However, it should be understood that the size of the lid 60, as well as the placement of the plurality of angled steps 62 may vary according to the size of casing 10 and the placement of the plurality of movable vertical columns 18 in the casing 10.

Figure 6:
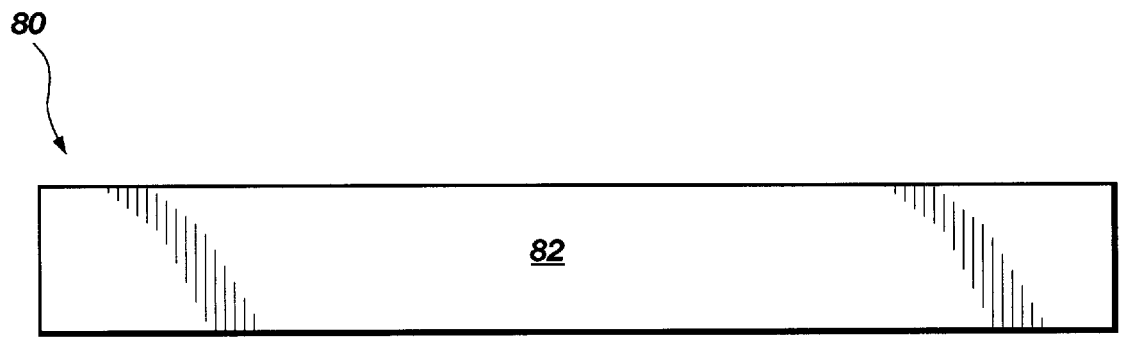
FIG. 6 is a top view of an optional support plate placed beneath the lead frame stack within the casing.

Referring to FIG. 6, a top view of a support plate 80 is shown. The support plate 80 comprises a substantially planar surface 82 adapted to support a vertically-stacked plurality of lead frame strips 12. The support plate 80 will typically have a width and length substantially corresponding to the length and width of the lead frame strips 12. Alternatively, the support plate 80 will have a width and length that is smaller than the width and length of the lead frame strips 12 supported thereon. It should be understood that the width and length of the support plate 80 will vary as the overall casing design dictates.

Figure 7:
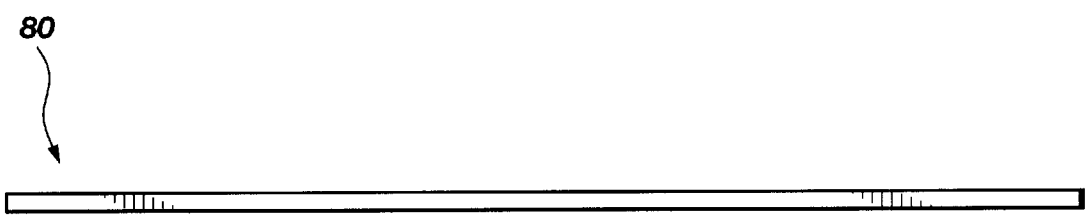
FIG. 7 is a side view of the support plate of FIG. 6.

FIG. 7 is a side view of the support plate 80. In a preferred embodiment, the support plate 80 is about 0.05 to 0.10 inches in thickness. However, it is understood that the thickness of the support plate 80 may vary according to its material and to the weight and number of lead frame strips 12 to be carried thereon. The support plate 80 should be of sufficient torsional and bending rigidity for support of the lead frame strips during loading and unloading of the lead frame strips 12. As previously noted, support plate 80 is sized to extend beyond the boundaries of the aperture in base 14.

The lid 60 is secured to the top of lead frame casing 10 of the present invention by a snap-lock or slide-lock mechanism as known in the art. By way of example only, casing 10 may include a plurality of inwardly-projecting tabs 90 as shown in FIGS. 1 and 2. Tabs 90 are engaged by resilient clips 92 on the underside of lid 60 when lid 60 is slid over the top of casing 10 from left to right, as the drawing figures are oriented. Other locking mechanisms as known in the art are also contemplated as having utility with the invention.

In use, the casing 10 is loaded with suitably sized lead frame strips 12, strips 12 being parallel to the base 14 of casing 10 and in substantially superimposed mutual relationship. Typically, 150 to 200 lead frame strips 12 would be stacked in a casing, unless paper or plastic strips are interleaved with the lead frame strips 12, in which case the number of strips 12 would be reduced. When the casing 10 is fully loaded, lid 60 is placed over casing 10 so that the resilient clips 92 extend into the casing interior and are to the right of their respective tabs. The lid 60 is then slid to the left as noted above until tabs 90 are engaged by resilient clips 92 in a "snap-lock" or "slide lock" connection. As lid 60 slides over casing 10 and tabs 90 and clips 92 engage, angled steps 62a, 62a and 62a respectively engage the distal sides 52 of each of their associated columns 18a, 18b and 18c, and rotationally deflect columns 18 about 2° to 4° toward volume V so that their proximal sides 50 are substantially vertical and adjacent lead frame strip stack 12, in the process aligning one side and one end of each of the lead frames in the stack with references planes R1 and R2, respectively. As noted with respect to FIGS. 1 and 2, cut-out 34 permits step 62c to enter the interior of casing 10 from the end of the casing 10 as lid 60 slides to the left.

The casing 10 and lid 60 of the invention are preferably fabricated from or coated with an anti-static material and, most preferably, are formed of a molded nonmetal such as a synthetic resin, examples of which include polypropylene, polyethylene, an olefin series resin such as a copolymer of the foregoing materials, a polyacetal resin, or an ABS resin. Many other suitable materials having desirable characteristics for the casing and lid (strength, impact-resistance, transparency, etc.) are also known in the art.

The lid 60 and casing 10 are preferably injection-molded using a master mold defining the outer casing dimensions and having relocatable segments to relocate columns 16 and 18 on the casing interior to define various sizes of volume V for different lengths and widths of lead frame strips 12 which a particular casing 10 is intended to accommodate. The mold for lid 60 may similarly include relocatable segments to move angled steps 62 to correspond to relocated columns 18. It is contemplated that only one set of columns, for example fixed or rigid columns 16, may be relocated to vary the length and width of volume V. In such a case, flexible columns 18 and angled steps 62 may be permanently placed. Alternatively, only flexible columns 18 and steps 62 may be relocated.

Variations of the illustrated preferred embodiment are numerous and contemplated as being within the scope of the invention. For example, more than two columns may be employed along each side of the casing volume V; the lid 60 may be designed to snap vertically down over casing 10 and deflect columns 18 inwardly; the proximal sides of the columns 16 and 18 may be arcuate rather than flat; the casing may be formed with low or no side and end walls and the lid may be formed with side and end walls which extend over the columns and the lead frame stack and engage the base; the casing may be formed with an open end and the lid include a downwardly-protruding column in lieu of column 18c which engages the right-hand end of the lead frame stack when the lid slides from left to right and aligns the opposing end of the stack against column 16c and reference plane R1; rigid columns 16 may be supported by buttresses fixed to the base 14 of the casing 10 rather than the walls; a continuous inner rigid wall may be employed along one side of volume V instead of columns if the lateral access to the strips is required; and/or a single resilient inner wall may be employed along one side of volume V in like manner.

While the present invention has been described in terms of certain embodiments, it is not so limited, and those of ordinary skill in the art will readily recognize and appreciate that many additions, deletions and modifications to the embodiments described herein may be made without departing from the scope of the invention as hereinafter claimed.

What is claimed is:

1. An apparatus for storing a stack of lead frame strips comprising:

a casing including a base for supporting the lead frame strip stack and a plurality of walls extending upwardly from said base and defining a top opening into said casing;

at least one reference guide member disposed within said plurality of side walls and coupled to said base for providing at least one reference plane against which the stacked lead frame strips may be aligned;

at least one resilient guide member coupled to said base and spaced from said at least one reference guide member;

a lid adapted for substantially covering said casing; and at least one actuating member coupled to said lid for moving at least a portion of said at least one resilient guide member toward said at least one reference guide member to substantially align stacked lead frame strips disposed within said casing against said reference plane and substantially immobilize said stacked lead frame strips within said casing.

2. The apparatus of claim 1, wherein said walls include at least one opening therethrough.

3. The apparatus of claim 1, wherein said at least one reference guide member comprises at least one substantially rigid vertical column.

4. The apparatus of claim 3, wherein said at least one substantially reference vertical column includes a beveled tip for guiding lead frame strips contacted thereby towards a central volume of the casing.

5. The apparatus of claim 1, wherein said at least one resilient guide member comprises at least one deflectable vertical column.

6. The apparatus of claim 5, wherein said at least one deflectable vertical column includes a segment of a reduced cross section proximate a point of attachment of said deflectable vertical column to said base for enhancing flexibility of said at least one deflectable vertical column.

7. The apparatus of claim 6, wherein the height of said segment of reduced cross section is greater than the depth of said segment.

8. The apparatus of claim 5, wherein said at least one deflectable vertical column includes a beveled tip for guiding lead frame strips contacted thereby towards a central volume of the casing.

9. The apparatus of claim 5, wherein said at least one deflectable vertical column includes a proximal side which faces a central volume of said casing and slopes upwardly and away from said central volume.

10. The apparatus of claim 5, wherein said at least one deflectable vertical column includes a distal side which faces away from a central volume of said casing and slopes upwardly and toward the center of said casing.

11. The apparatus of claim 1, wherein said at least one actuating member comprises at least one angled step.

12. The apparatus of claim 11, wherein said at least one angled step includes an inner side, said inner side being positioned to face a central area of said lid and being sloped outwardly and away from the central area of said lid.

13. The apparatus of claim 1 further including a locking means for locking said lid to said casing over said top opening.

14. The apparatus of claim 13, wherein said locking means comprises a slide-locking mechanism.

15. The apparatus of claim 1 further including support means for supporting the lead frame strips over said base within a central volume of said casing.

16. The apparatus of claim 15, wherein said support means comprises a substantially planar support plate extending over an aperture through said base.

17. The apparatus of claim 16, wherein said support plate is shorter and narrower than the lead frame strips supported thereon.

18. A method of loading and storing lead frame strips comprising:

provifing a casing adapted for receiving a plurality of lead frame strips, said casing including a base for supporting the lead frame strips and a plurality of walls attached to said base and defining a top opening for said casing;

providing at least one reference guide member for creating at least one reference plane against which the lead frame strips may be aligned;

providing at least one resilient guide member spaced from said at least one reference guide member;

disposing a stack of lead frame strips between said at least one reference guide member and said at least one resilient guide member;

providing a lid adapted for placement on said top opening for substantially covering said casing top opening;

providing at least one actuating member on said lid for moving at least a portion of said at least one resilient guide member toward said at least one reference guide member;

placing said lid over said top opening; and locking said lid onto said casing, contacting said at least one resilient guide member with said at least one actuating member, and moving at least a portion of said at least one resilient guide member towards said at least one reference guide member and substantially aligning the lead frame strips with said at least one reference plane and substantially immobilizing said lead frame strips between said at least one resilient guide member and said at least one reference guide member.

19. A container for receiving a plurality of lead frame strips in a vertical stack, comprising:

a base extending two-dimensionally and substantially in a single plane;

at least one reference member extending transversely upwardly from said base and defining at least one reference plane adjacent a volume above said base within which said stack is received;

at least one resilient member extending transversely upwardly from said base and adjacent said volume for biasing the lead frame strips of said stack transversely toward said at least one reference plane;

an aperture in said base below said volume; and a support plate disposed over said aperture.

* * * * *